United States Patent
Alidio et al.

[11] Patent Number: 5,351,013
[45] Date of Patent: Sep. 27, 1994

[54] STEP ATTENUATOR USING PIN DIODES

[75] Inventors: Raul I. Alidio, Lawndale; Clinton O. Holter, Long Beach, both of Calif.

[73] Assignee: Hughes Aircraft Company, Los Angeles, Calif.

[21] Appl. No.: 29,075

[22] Filed: Mar. 10, 1993

[51] Int. Cl.5 .............................................. H03G 3/10
[52] U.S. Cl. ................................... 320/284; 330/286; 330/289; 333/81 A; 333/81 R
[58] Field of Search ........................ 330/284, 289, 286; 333/81 A, 81 R

[56] References Cited

U.S. PATENT DOCUMENTS 4,621,244  11/1986  Heiter ............................. 333/81 A

FOREIGN PATENT DOCUMENTS 8203979  5/1984  Netherlands ........................ 330/284

OTHER PUBLICATIONS

Atkins, Attenuators, Jul. 1988 p. 72.

*Primary Examiner*—James B. Mullins
*Assistant Examiner*—Jim Dudek
*Attorney, Agent, or Firm*—L. A. Alkov; W. K. Denson-Low

[57] ABSTRACT

A step attenuator using a PIN diode for use with microwave circuits. The step attenuator circuit provides for stepwise controlling the current applied to the microwave monolithic integrated circuit. The step attenuator circuit comprises a driver circuit and a attenuator circuit coupled thereto. The driver circuit that comprises a temperature sensor, a comparator circuit coupled to the temperature sensor for comparing the temperature value sensed by the temperature sensor to predetermined reference voltages and for providing a plurality of output signals that are indicative of a respective plurality of temperature values sensed by the temperature sensor, and a resistor network coupled to the comparator circuit that is adapted to set the respective values or current provided by the driver circuit. The attenuator circuit comprises a PIN diode coupled to the microwave circuit (MIC or MMIC) that has the temperature sensor coupled thereto, a plurality of resistors respectively coupled to receive the plurality of output signals from the comparator circuit, and a resistor coupled between the plurality or resistors and the PIN diode. Alternatively, a λ/4 microstrip circuit may be used in place of the single resistor. Attenuator bits (4 bits, for example) are controlled by the PIN diode driver that determines the current on each bit. The step attenuator provides temperature compensation for a chain of microwave amplifiers. For example, an amplifier chain containing two MMIC amplifiers may vary 4 dB in overall gain over the range of −55 degrees C. to +71 degrees C. When the gain drops by 1 dB, an attenuator bit turns off, increasing the gain up to a nominal value. When the gain increases by 1 dB (as temperature decreases), an attenuator bit turns on, decreasing the gain down to the nominal value. The present step attenuator may use two PIN diodes in a balanced design.

14 Claims, 1 Drawing Sheet

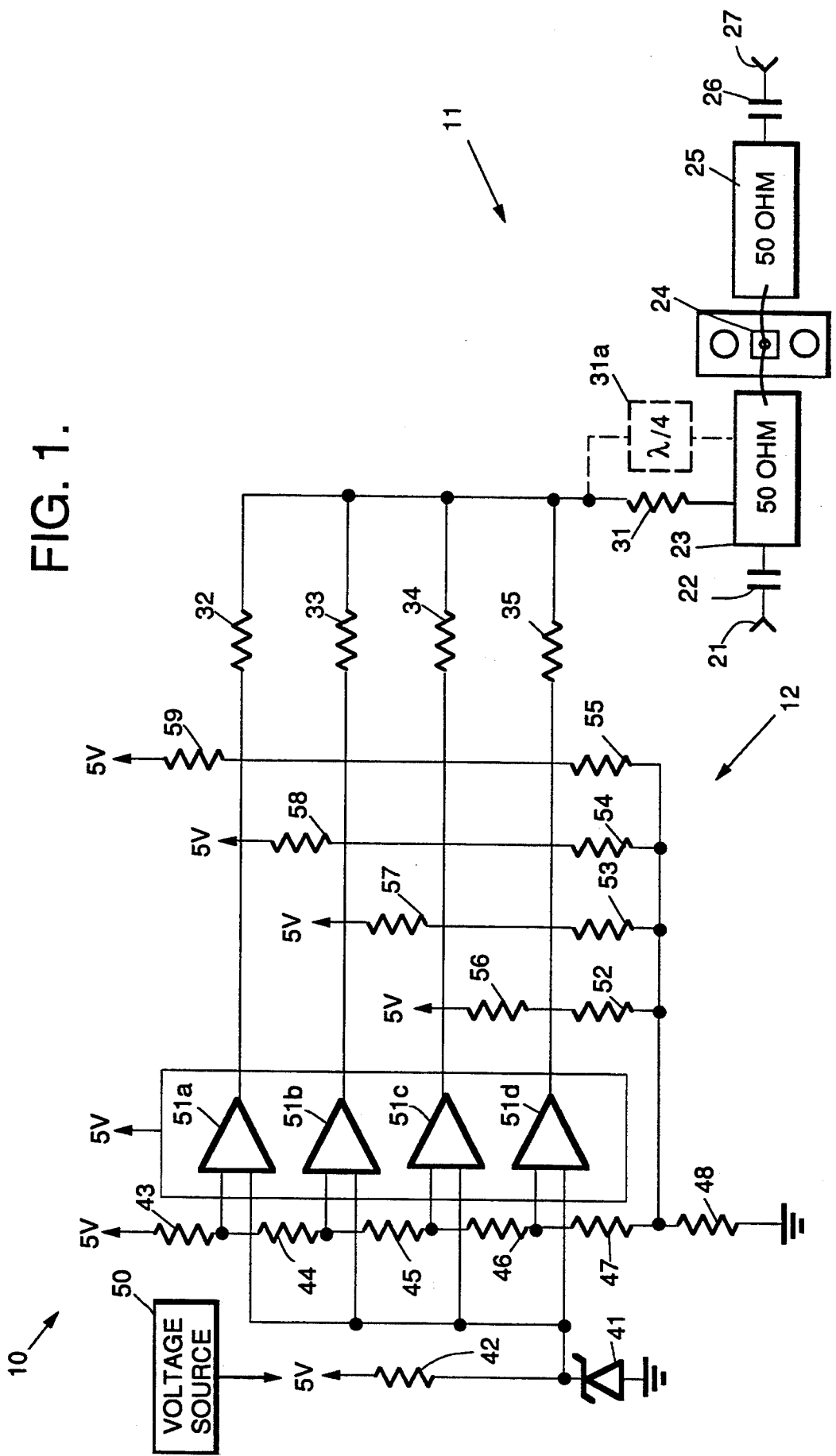

STEP ATTENUATOR USING PIN DIODES

BACKGROUND

The present invention relates generally to step attenuators, and more particularly, to a step attenuator circuit that uses a PIN diode and which is adapted for use in temperature compensation devices employed with monolithic microwave integrated circuits) MMIC) and microwave integrated circuits (MIC).

Previously, one of the ways to provide for temperature compensation microwave amplifiers, such a discrete and MMIC amplifiers, and the like, was achieved by controlling the current through a shunt diode in conjunction with a single thermistor circuit. The attenuation produced by this arrangement was dependent upon the amount of current passing through the diode. Consequently, the amount of attenuation produced by this arrangement was variable, as a function of current, and was not fixed as is achievable by a step attenuator. Tuning the thermistor circuit was necessary to provide a correct attenuation range that was required for a given temperature range. This typically involves time-consuming temperature tests in order to produce a circuit that satisfied requirements.

Consequently, it is an objective of the present invention to provide for an attenuator that provides for fixed attenuation steps. It is a further objective of the present invention to provide for an attenuator for use in temperature compensation devices that reduces testing time and provides for control in achieving compensation over desired temperature ranges.

SUMMARY OF THE INVENTION

In order to meet the above objectives, the present invention provides for a step attenuator that incorporates a PIN diode. The attenuator bits (4 bits for example) are controlled by a PIN diode driver that determines the current on each bit. When using a temperature sensor circuit on the PIN driver, attenuation of 1 dB+0.5 dB is achieved at 4 equal intervals within a temperature range of −55 degrees C. to +71 degrees C.

More particularly, the step attenuator circuit provides for stepwise controlling the current applied to microwave integrated circuits (MIC) and monolithic microwave integrated circuits (MMIC). The step attenuator circuit comprises a driver circuit and a attenuator circuit coupled thereto. The driver circuit that comprises a temperature sensor, a comparator circuit coupled to the temperature sensor for comparing the temperature value sensed by the temperature sensor to predetermined reference voltages and for providing a plurality of output signals that are indicative of a respective plurality of temperature values sensed by the temperature sensor, and a resistor network coupled to the comparator circuit that is adapted to set the respective values of current provided by the driver circuit. The attenuator circuit comprises a PIN diode coupled to the microwave integrated circuit or monolithic microwave integrated circuit and having the temperature sensor coupled thereto, a plurality of resistors respectively coupled to receive the plurality of output signals from the comparator circuit, and a resistor coupled between the plurality of resistors and the PIN diode. Alternatively, a λ/4 microstrip circuit may be coupled between the plurality of resistors and the PIN diode.

The present step attenuator circuit provides temperature compensation for a chain of microwave amplifiers. For example, an amplifier chain containing two MMIC amplifiers may vary 4 dB in overall gain over the range of −55 degrees C. to +71 degrees C. When the gain drops by 1 dB, an attenuator bit turns off, increasing the gain up to a nominal value. When the gain increases by 1 dB (as temperature decreases), an attenuator bit turns on, decreasing the gain down to the nominal value. The advantages of the present step attenuator circuit are more precise control of attenuation range when compared to conventional temperature compensation designs, and the use of a single PIN diode instead of a monolithic microwave integrated circuit (MMIC) step attenuator, thus reducing manufacturing costs. The present step attenuator circuit may use two PIN diodes in a balanced design.

The step attenuator circuit of the present invention provides for improved electrical test times and temperature performance of microwave integrated circuits and monolithic microwave integrated circuits with which it is employed, which in turn, increases producibility yields. In addition, using the present step attenuator circuit significantly reduce tests times and provides more control in achieving a desired temperature range for the MMIC amplifiers.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 1 illustrates a 4-bit attenuator circuit in accordance with the principles of the present invention, and illustrates a driver circuit employed with the 4-bit attenuator circuit.

DETAILED DESCRIPTION

Referring to the drawing figures, the present invention comprises a step attenuator circuit 10 that includes an attenuator circuit 11 and a driver circuit 12. The step attenuator circuit 10 shown in FIG. 1 is a 4-bit step attenuator, which is shown by way of example. It is to be understood that other step configurations may be employed using the principles of the present invention, and it is not limited to four steps of attenuation. FIG. 1 illustrates the attenuator circuit 11, and the driver circuit 12 employed with the 4-bit attenuator circuit 11.

Referring to FIG. 1, the attenuator circuit 11 has an input (IN) 21 that is AC coupled by means of a first bypass capacitor 22 through a first 50 ohm line 23 to a PIN diode 24, and from the PIN diode 24 through a second 50 ohm line 25 through a second bypass capacitor 26 to an output (OUT) 27. The first 50 ohm line 23 is coupled by way of a resistor 31 to four parallel resistors 32–35. Alternatively, a λ/4 microstrip circuit may be coupled between the plurality of resistors and the PIN dime, as is illustrated by means of the λ/4 microstrip circuit shown with dashed lines and connected in parallel with the resistor 31. Each of the resistors 32–35 are individually coupled to inputs of the driver circuit 12. Each of the resistors 32–35 respectively provide bit 1, bit 2, bit 3, and bit 4 signals that are adapted to each provide for 1 dB attenuation levels.

The driver circuit 12 is comprised of a temperature sensor 41 having one terminal coupled to ground and a second terminal coupled by way of a resistor 42 to a voltage source 50. The temperature sensor 41 is coupled to the PIN diode 24 in order to sense its heat output. The temperature sensor 41 may comprise a model LM135 temperature sensor manufactured by Motorola, for example. An output signal from the temperature sensor 41 is taken between the temperature sensor 41 and the resistor 42 and is coupled to a inputs of a quad comparator 51, such as a model LM139 quad comparator manufactured by Motorola, for example. Each of the four comparators 51a-5d is coupled to receive the output signal from the temperature sensor 41 at one input, and the other respective input of each of the four comparators 51a-5d is coupled by way of a divider network comprising six resistors 43, 44, 45, 46, 47, 48 that are coupled between the voltage source 50 and ground. Each of the respective inputs of the four comparators 51a-5d is coupled to a point between two of the resistors, such as between resistors 43 and 44 for the first comparator 51a, for example, and so forth.

In the attenuator circuit 11, each bit (derived through resistors 32-35) provides for 1 dB attenuation, and thus the attenuator circuit 11 provides for a total of 4 dB attenuation. The value for the resistor 32-35 in each channel was determined such when bit 1 is on, the step is 1 dB. When bit 1 and bit 2 are on, the attenuation step is 2 dB. When all bits are on, the attenuation step is 4 dB. Larger or smaller steps may be achieved by changing the values of the resistors 32-35 in each channel to appropriate values that produce the desired steps.

The primary components of the driver circuit 12 are the quad voltage comparator 51 and the precision temperature sensor 41, along with the resistor network: having appropriate resistor values. The driver circuit 12 is adapted to turn the bits of the attenuator circuit 11 on and off at the appropriate temperatures for each bit. For example, the bits may be controlled such that each bit turns on and off at equal intervals between a given temperature range, say every 30 degrees C. from $-50$ degrees C. to $+70$ degrees C., for example.

The 4-bit step attenuator circuit 10 is intended for use in an L-band application, but it may be incorporated into circuits for use at higher frequencies. Preliminary tests were made on the 4-bit step attenuator circuit 10 at X-band. In a balanced configuration, employing two PIN diodes, a 4 dB $+0.20$ dB attenuator in 1 dB steps was measured from 9 GHz to 10 GHz.

For completeness, the following is a listing of the values for the resistors and capacitors shown in FIG. 1. resistor 32=36 Kohms; resistor 33=26 Kohms; resistor 34=26 Kohms; resistor 35=26 Kohms; resistor 42=36 Kohms; resistor 43=3.6 Kohms; resistor 44=500 ohms; resistor 45=500 ohms: resistor 46=500 ohms; resistor 47=4815 ohms; resistor 48=10 ohms; resistor 52=10 Kohms resistor 53=10 Kohms; resistor 54=10 Kohms; resistor 55=10 Kohms; resistor 56=10 Kohms; resistor 57=10 Kohms; resistor 58=10 Kohms; resistor 59=10 Kohms; capacitor 22=220 picofarads; capacitor 26=220 picofarads; and resistor 31=1 Kohms.

Thus there has been described a new and improved step attenuator circuit that uses a PIN diode which is adapted for use in temperature compensation devices employed with microwave integrated circuits and microwave monolithic integrated circuits. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A step attenuator circuit for stepwise controlling the current applied to a microwave circuit, said step attenuator circuit comprising:
   a driver circuit that comprises:
   a temperature sensor;
   a comparator circuit coupled to the temperature sensor for comparing the temperature value sensed by the temperature sensor to predetermined reference voltages and for providing a plurality of output signals that are indicative of a respective plurality of temperature values sensed by the temperature sensor; and
   a resistor network coupled to the comparator circuit for setting the respective values of current provided by the driver circuit; and
   an attenuator circuit coupled to the driver circuit that comprises:
   a PIN diode coupled to the microwave circuit and having the temperature sensor coupled thereto;
   a plurality of resistors respectively coupled to receive the plurality of output signals from the comparator circuit; and
   coupling means coupled between the plurality of resistors and the PIN diode.

2. The step attenuator circuit of claim 1 wherein the coupling means comprises a resistor.

3. The step attenuator circuit of claim 1 wherein the coupling means comprises a λ/4 microstrip circuit.

4. The step attenuator circuit of claim 1 wherein the microwave circuit comprises a microwave monolithic integrated circuit.

5. The step attenuator circuit of claim 1 that comprises a 4-bit step attenuator.

6. A step attenuator circuit for stepwise controlling the current applied to a microwave integrated circuit, said step attenuator circuit comprising:
   a driver circuit that comprises:
   a temperature sensor;
   a comparator circuit coupled to the temperature sensor for comparing the temperature value sensed by the temperature sensor to predetermined reference voltages and for providing a plurality of output signals that are indicative of a respective plurality of temperature values sensed by the temperature sensor; and
   a resistor network coupled to the comparator circuit for setting the respective values of current provided by the driver circuit; and
   an attenuator circuit coupled to the driver circuit that comprises:
   a PIN diode coupled to the microwave integrated circuit and having the temperature sensor coupled thereto;
   a plurality of resistors respectively coupled to receive the plurality of output signals from the comparator circuit; and
   coupling means coupled between the plurality of resistors and the PIN diode.

7. The step attenuator circuit of claim 6 wherein the coupling means comprises a resistor.

8. The step attenuator circuit of claim 6 wherein the coupling means comprises a λ/4 microstrip circuit.

9. The step attenuator circuit of claim 6 wherein the microwave integrated circuit comprises a microwave monolithic integrated circuit.

10. The step attenuator circuit of claim 6 that comprises a 4-bit step attenuator.

11. A step attenuator circuit for stepwise controlling the current applied to a monolithic microwave integrated circuit, said step attenuator circuit comprising:
a driver circuit that comprises:
a temperature sensor;
a comparator circuit coupled to the temperature sensor for comparing the temperature value sensed by the temperature sensor to predetermined reference voltages and for providing a plurality of output signals that are indicative of a respective plurality of temperature values sensed by the temperature sensor; and
a resistor network coupled to the comparator circuit for setting the respective values of current provided by the driver circuit; and
an attenuator circuit coupled to the driver circuit that comprises:
a PIN diode coupled to the microwave integrated circuit and having the temperature sensor coupled thereto;
a plurality of resistors respectively coupled to receive the plurality of output signals from the comparator circuit; and
coupling means coupled between the plurality of resistors and the PIN diode.

12. The step attenuator circuit of claim 11 wherein the coupling means comprises a resistor.

13. The step attenuator circuit of claim 11 wherein the coupling means comprises a $\lambda/4$ microstrip circuit.

14. The step attenuator circuit of claim 11 that comprises a 4-bit step attenuator.

* * * * *